United States Patent
Tu et al.

[19]

[11] Patent Number: 6,124,182
[45] Date of Patent: Sep. 26, 2000

[54] METHOD OF FORMING STACKED CAPACITOR

[75] Inventors: Yeur-Luen Tu, Taichung; Sian-Min Chung, Taipei Hsien, both of Taiwan

[73] Assignee: Taiwan Semiconductor Manufacturing Corporation, Hsinchu, Taiwan

[21] Appl. No.: 09/206,807

[22] Filed: Dec. 7, 1998

[51] Int. Cl.$^7$ .................................................. H01L 21/20
[52] U.S. Cl. ........................ 438/396; 438/398; 438/665; 438/253; 438/255
[58] Field of Search .................................. 438/253, 255, 438/396, 398, 665

[56] References Cited

U.S. PATENT DOCUMENTS

| | | | |
|---|---|---|---|
| 5,795,805 | 8/1998 | Wu et al. | 438/253 |
| 6,037,624 | 3/2000 | King | 257/309 |
| 6,040,215 | 3/2000 | Takaishi | 438/253 |
| 6,043,131 | 3/2000 | Yu | 438/396 |

*Primary Examiner*—Carl Whitehead, Jr.
*Assistant Examiner*—Jamie L. Davis
*Attorney, Agent, or Firm*—Blakely, Sokoloff, Taylor, & Zafman LLP

[57] ABSTRACT

A method of forming a bottom storage node of a capacitor on a substrate is disclosed. The method comprises the steps of: forming a first insulating layer atop said substrate; patterning and etching through said first insulating layer until said substrate is reached to form a bitline contact opening; depositing a conducting layer into said bitline contact opening and atop said first insulating layer; patterning and etching said conducting layer to form a bitline; depositing a second insulating layer atop said bitline and said first insulating layer; depositing a nitride layer atop said second insulating layer; depositing a third insulating layer atop said nitride layer; patterning and etching said first insulating layer, said second insulating layer, said nitride layer, and said third insulating layer, stopping at said substrate, to form a first storage node contact opening; depositing an amorphous polysilicon layer into said first storage node contact opening and atop said third insulating layer; patterning and etching said amorphous polysilicon layer and said third insulating layer, stopping at said nitride layer, to form a second storage node contact opening; forming amorphous polysilicon sidewall spacers along sidewalls of said second storage node contact opening; and depositing hemispherical grain (HSG) polysilicon on said amorphous polysilicon layer and said amorphous polysilicon sidewall spacers.

8 Claims, 4 Drawing Sheets

METHOD OF FORMING STACKED CAPACITOR

FIELD OF THE INVENTION

The present invention relates to a method of manufacturing dynamic random access memory (DRAM), and more specifically, to a method of manufacturing a stacked capacitor.

BACKGROUND OF THE INVENTION

It has been the trend to scale down the sizes of memory cells to increase the integration level and thus memory capacity of a DRAM chip. As the size of DRAMs is decreased, the capacity of the capacitor used in the DRAM is correspondingly decreased.

A memory cell of DRAM typically consists of a storage capacitor and an access transistor. With the advent of large-scale integrated DRAM devices, the size of the devices has gotten smaller and smaller such that the available area for a single memory cell has become very small. This causes a reduction in the capacitor's area, resulting in the reduction of the cell's capacitance.

One method for increasing capacitance area involves forming hemispherical grain (HSG) polysilicon on amorphous polysilicon and increasing capacitor height. However, increasing capacitor height requires an increase in the thickness of the amorphous polysilicon layer which requires an increased deposition time for the amorphous polysilicon layer. An increased deposition time causes crystallization of the amorphous polysilicon. Crystallization of the amorphous polysilicon inhibits silicon migration resulting in poor HSG formation atop the amorphous polysilicon, thereby decreasing area gain.

Furthermore, the step height difference of the conventional stacked capacitor creates difficulty in planarization. The conventional stacked capacitor has a bottom storage node height (or amorphous polysilicon layer thickness) of 6000 to 9000 angstroms and a polysilicon top plate thickness of 500 to 1500 angstroms. The step height difference between the cell and the peripheral layers renders planarization difficult.

Therefore, there is a need for an improved method of manufacturing a stacked capacitor that reduces crystallization of the amorphous polysilicon and that allows improved planarization.

SUMMARY OF THE INVENTION

A method of forming a bottom storage node of a capacitor on a substrate is disclosed. The method comprises the steps of: forming a first insulating layer atop said substrate; patterning and etching through said first insulating layer until said substrate is reached to form a bitline contact opening; depositing a conducting layer into said bitline contact opening and atop said first insulating layer; patterning and etching said conducting layer to form a bitline; depositing a second insulating layer atop said bitline and said first insulating layer; depositing a nitride layer atop said second insulating layer; depositing a third insulating layer atop said nitride layer; patterning and etching said third insulating layer, said nitride layer, said second insulating layer, and said first insulating layer, stopping at said substrate, to form a first storage node contact opening; depositing an amorphous polysilicon layer into said first storage node contact opening and atop said third insulating layer; patterning and etching said amorphous polysilicon layer and said third insulating layer, stopping at said nitride layer, to form openings; forming amorphous polysilicon sidewall spacers along sidewalls of said openings; and depositing hemispherical grain (HSG) polysilicon on said amorphous polysilicon layer and said amorphous polysilicon sidewall spacers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the accompanying drawings. The present invention provides a method of forming a stacked DRAM capacitor.

Figure 1:
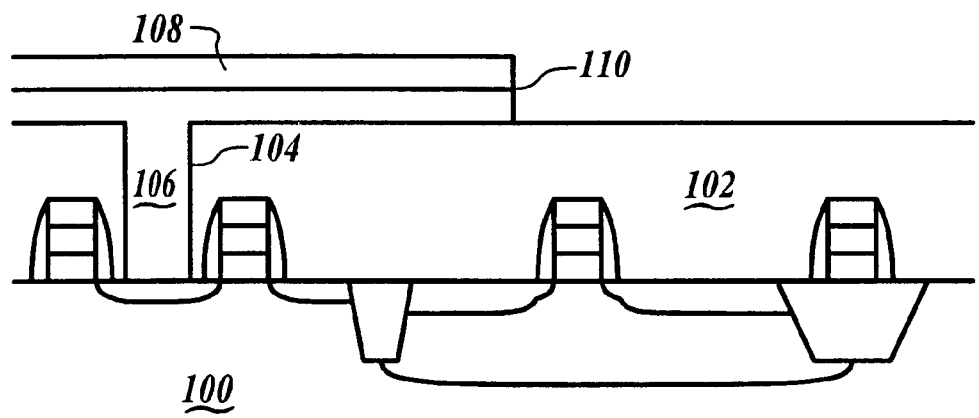
FIGS. 1–7 show cross-sectional views of a semiconductor substrate, illustrating the steps of the present invention for forming a stacked capacitor.

Turning to FIG. 1, a semiconductor substrate 100 is shown. The substrate is understood to possibly include a semiconductive wafer, active and passive devices formed within the wafer, and layers formed on the wafer's surface. The term "substrate" is meant to include devices formed within a semiconductor wafer and the layers overlying the wafer.

In FIG. 1, a first insulating or oxide layer 102 is formed atop the substrate 100. The insulating layer may be formed from silicon oxide, borophosphosilicate glass (BPSG), or any combination thereof. A bitline contact opening 104 is made using conventional photolithography and etching techniques. The etching is controlled to stop when the substrate 100 is reached. A polysilicon layer 106 is deposited into the bitline contact opening 104 and atop the first oxide layer 102 using any conventional technique. For example a chemical vapor deposition (CVD) process using phosphine and silane as reactant gases may be used. Preferably, the polysilicon layer 106 has a thickness of about 500–1000 angstroms. A tungsten silicide layer 108 is formed atop the polysilicon layer 106. The tungsten silicide layer 108 is preferably about 1000 angstroms thick. Using conventional patterning and etching techniques, the polysilicon layer 106 and the tungsten silicide layer 108 are etched until the first oxide layer 102 is reached. This results in a composite structure 110, consisting of a polysilicon layer 106 and tungsten silicide layer 108, above the bitline opening 104. The polysilicon layer 106 and tungsten silicide layer 108 form the bitline connection of the DRAM cell.

Figure 2:
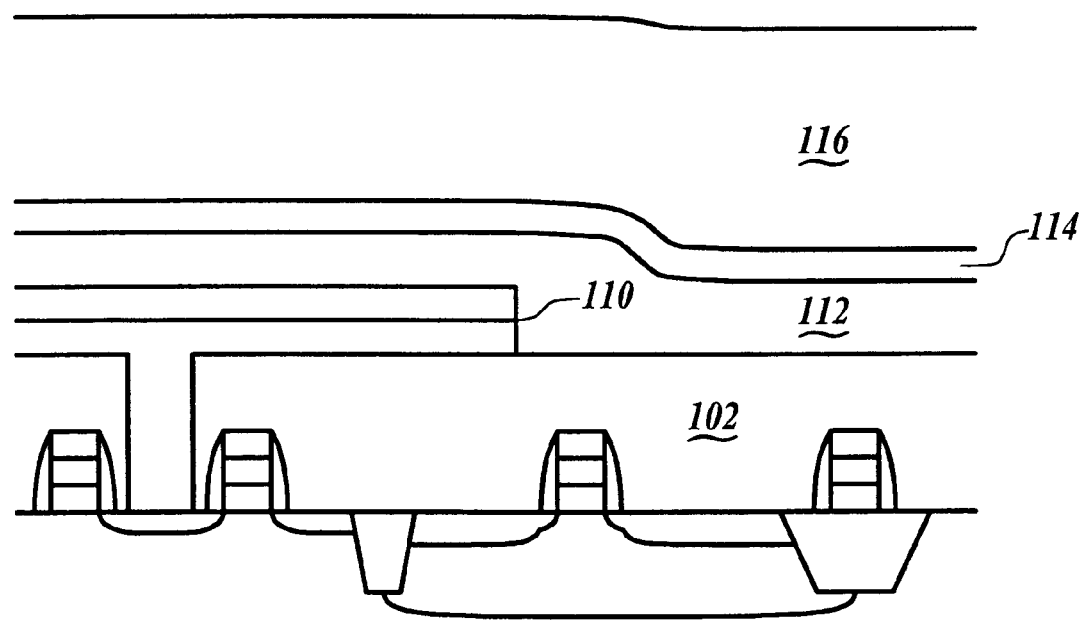

Turning to FIG. 2, a second silicon oxide layer 112, preferably about 2000 to 4000 angstroms thick, is deposited atop the composite structure 110 and the first oxide layer 102. Next, a silicon nitride layer 114, preferably about 150 to 500 angstroms thick, is deposited atop the second oxide layer 112. A third silicon oxide layer 116, preferably about 6000 to 9000 angstroms thick, is deposited atop the nitride layer 114. Preferably, a conventional technique using plasma-enhanced TEOS or plasma-enhanced silane is utilized to deposit the third oxide layer. This techniques offers a low cost, high deposition rate advantage.

Figure 3:
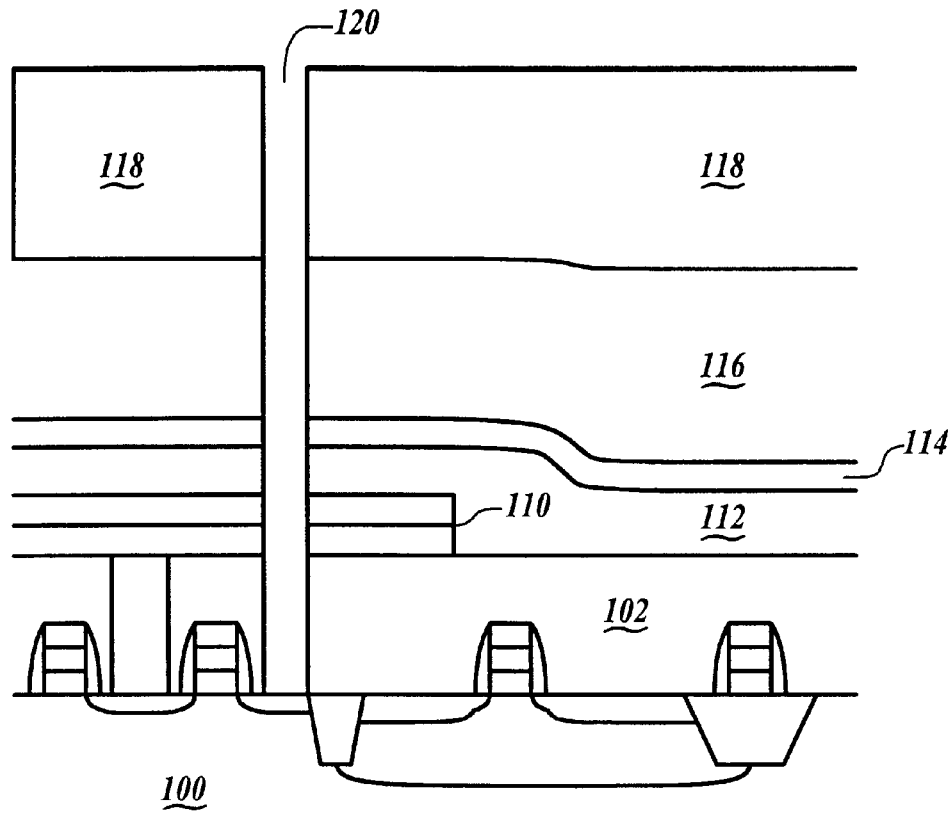

Turning to FIG. 3, a photoresist layer 118 is deposited atop the third oxide layer 116 and is patterned and developed. The third oxide layer 116, the nitride layer 114, the second oxide layer 112, and the first oxide layer 102 are etched through by using the photoresist layer 118 as a mask, to form a first storage node contact opening 120. Note that although it appears in FIG. 3 as if the composite structure 110 is etched through, because the composite structure 110 is actually the bitline of the DRAM cell, the storage node contact opening either is formed in front of or behind the composite structure 110 to avoid contacting the bitline. The etching is controlled to stop at the substrate 100. The photoresist layer 118 is then stripped using any conventional technique.

Figure 4:
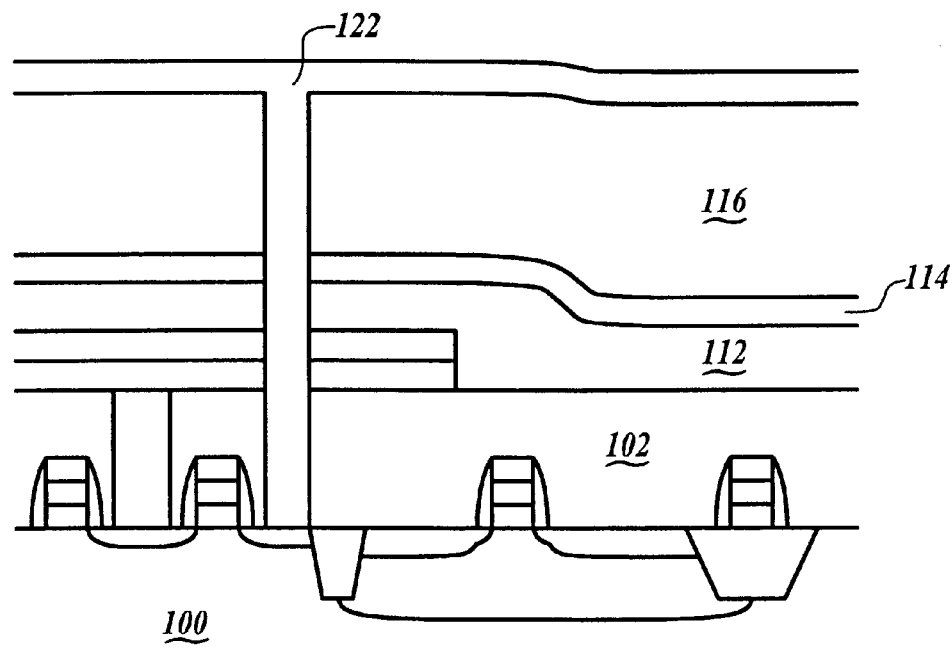

Turning to FIG. 4, an insitu doped amorphous polysilicon layer 122 is deposited into the contact opening 120 and atop the third oxide layer 116. The thickness of the amorphous polysilicon layer 122 is preferably about 500 to 1500 angstroms. The amorphous polysilicon layer 122 may be deposited using any known conventional technique, such as the use of silane as the reactant gas. A deposition temperature of the amorphous polysilicon is preferably between about 500 to 530° C.

Figure 5:
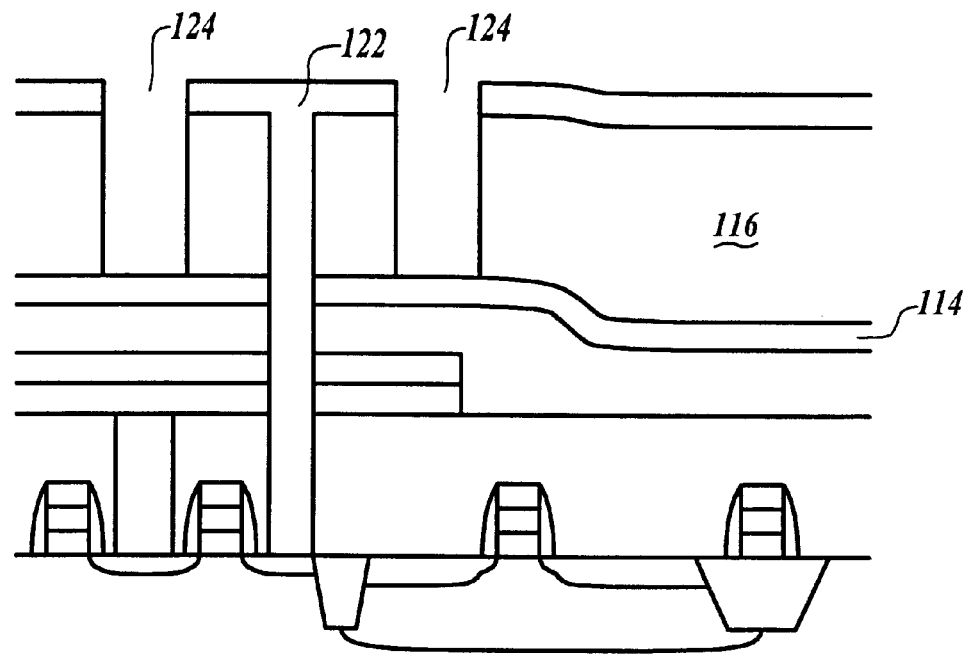

Turning to FIG. 5, openings 124 are formed by etching the amorphous polysilicon layer 122 and the third oxide layer 116. The etching is controlled to stop at the nitride layer 114. A conventional photolithography technique is used in etching the amorphous polysilicon layer 122 and the third oxide layer 116.

Figure 6:
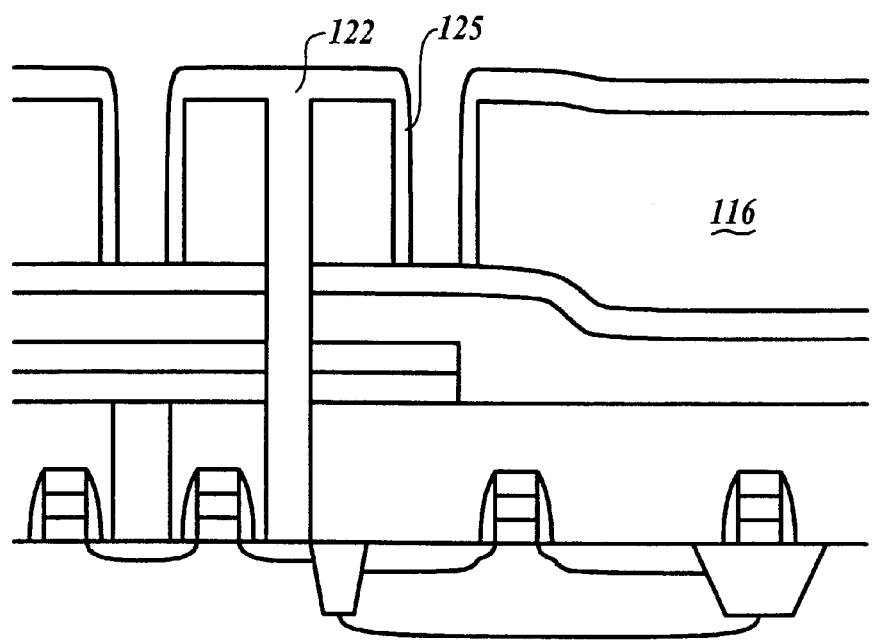

Turning to FIG. 6, a second insitu doped amorphous polysilicon layer is deposited over the top surface of the resulting structure of FIG. 5 to a thickness of about 400 to 750 angstroms. This amorphous polysilicon layer is then anisotropically etched (such as by reactive ion etching) to form amorphous polysilicon spacers 125 along the sidewalls of the third oxide layer 116. About 30 to 50 percent overetching is sufficient to form the spacers 125. While the anisotropic etching forms the spacers, preferably about 200 to 400 angstroms of the amorphous polysilicon layer 122 is also removed during the etching. As shown in FIG. 6, the amorphous silicon layer 122 and the amorphous silicon spacers 125 are in contact to form a bottom storage node.

Figure 7:
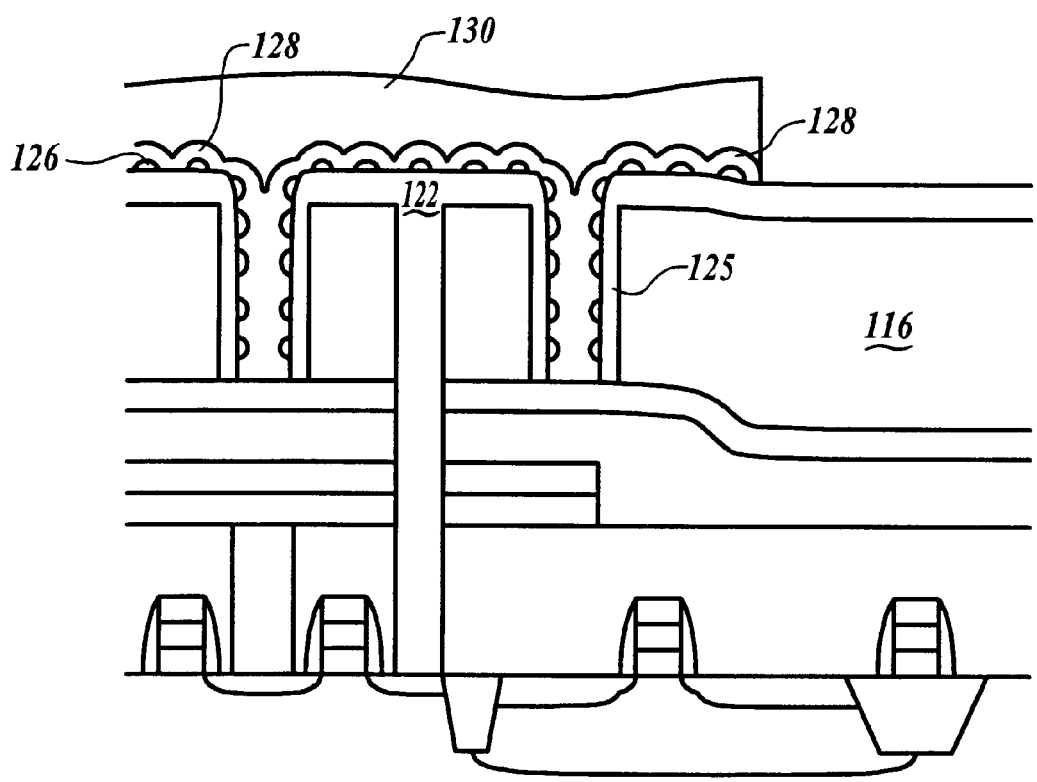

Turning to FIG. 7, hemispherical grain (HSG) polysilicon 126 is formed over the amorphous polysilicon layer 122 and the amorphous polysilicon spacers 125. The HSG polysilicon 126 is formed by a high vacuum anneal. An anneal temperature of the high vacuum is preferably about 560 to 660° C. Preferably, the HSG polysilicon 126 is formed using a seeding and high vacuum technique. In summary, silane or di-silane is used to seed the surface of the amorphous silicon. Next, the HSG polysilicon is formed in a high vacuum. In this manner, the bottom storage node is formed.

Finally, conventional deposition of a thin dielectric 128 and a top polysilicon layer 130 is performed to complete the capacitor. The thin dielectric layer 128 is preferably a composite layer of oxide/nitride/oxide (ONO) having a thickness less than 80 angstroms. To complete the DRAM capacitor, conventional photolithography patterning and etching are applied to remove the top polysilicon layer 130, the thin dielectric layer 128, the HSG polysilicon 126, and the amorphous polysilicon layer 122 at the cell boundary.

The final step height difference is therefore less than 2000 angstroms. The step height difference is reduced by the deposition of the thick third oxide layer 116 that is not removed at the peripheral, instead of a thick amorphous polysilicon layer used in conventional stacked capacitors. This reduced step height difference improves planarization. In addition, the total amorphous silicon used is about 900 to 2250 angstroms, compared to the 6000 to 9000 angstroms-thick amorphous silicon layers used in conventional stacked capacitors. The reduced thickness of the amorphous silicon requires less deposition time and therefore, reduces undesirable micro-crystallization of the amorphous silicon which will inhibit hemispherical grain (HSG) formation.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a bottom storage node of a capacitor on a substrate, the method comprising:

forming a first insulating layer atop said substrate;

patterning and etching through said first insulating layer until said substrate is reached to form a bitline contact opening;

depositing a conducting layer into said bitline contact opening and atop said first insulating layer;

patterning and etching said conducting layer to form a bitline;

depositing a second insulating layer atop said bitline and said first insulating layer;

depositing a nitride layer atop said second insulating layer;

depositing a third insulating layer atop said nitride layer;

patterning and etching said third insulating layer, said nitride layer, said second insulating layer, and said first insulating layer, stopping at said substrate, to form a first storage node contact opening;

depositing an amorphous silicon layer into said first storage node contact opening and atop said third insulating layer;

patterning and etching said amorphous silicon layer and said third insulating layer, stopping at said nitride layer, to form openings;

forming amorphous silicon sidewall spacers along sidewalls of said openings by etching said amorphous silicon layer, said sidewall spacers extending down in said openings to said nitride layer; and depositing hemispherical grain (HSG) polysilicon on said amorphous silicon layer and said amorphous silicon sidewall spacers.

2. The method of claim 1, wherein said first, said second, and said third insulating layers are formed of silicon oxide, borophosphosilicate glass (BPSG), or a combination thereof.

3. The method of claim 1, wherein said conducting layer is formed of polysilicon.

4. The method of claim 1, wherein said nitride layer is silicon nitride.

5. The method of claim 1, wherein said second insulating layer is about 2000 to 4000 angstroms thick.

6. The method of claim 1, wherein said nitride layer is about 150 to 500 angstroms thick.

7. The method of claim 1, wherein said third insulating layer is about 6000 to 9000 angstroms thick.

8. The method of claim 1, further including the steps of:

depositing a thin dielectric layer atop said bottom storage node; and forming a top polysilicon layer atop said dielectric layer.

* * * * *